(12) United States Patent
Brucha

(10) Patent No.: US 10,638,833 B1
(45) Date of Patent: May 5, 2020

(54) SYSTEM AND METHOD FOR A WORKSTATION POWER TROUGH

(71) Applicant: Bernard Brucha, Los Angeles, CA (US)

(72) Inventor: Bernard Brucha, Los Angeles, CA (US)

(*) Notice: Subject to any disclaimer, the term of this patent is extended or adjusted under 35 U.S.C. 154(b) by 88 days.

(21) Appl. No.: 16/101,236

(22) Filed: Aug. 10, 2018

(51) Int. Cl.
*A47B 21/06* (2006.01)
*H05K 5/02* (2006.01)
*H05K 5/03* (2006.01)

(52) U.S. Cl.
CPC .......... *A47B 21/06* (2013.01); *H05K 5/0217* (2013.01); *H05K 5/0247* (2013.01); *H05K 5/03* (2013.01); *A47B 2021/064* (2013.01); *A47B 2021/066* (2013.01); *A47B 2200/008* (2013.01); *A47B 2200/12* (2013.01)

(58) Field of Classification Search
CPC .............. A47B 21/06; A47B 2021/064; A47B 2021/066; A47B 2200/008; A47B 2200/12; H05K 5/0217; H05K 5/0247; H05K 5/03
USPC ............ 108/50.02, 50.01, 25, 26; 312/223.3, 312/223.6, 194–196
See application file for complete search history.

(56) References Cited

U.S. PATENT DOCUMENTS

| | | | |
|---|---|---|---|
| 939,125 A | * | 11/1909 | Fealy |
| 4,792,881 A | * | 12/1988 | Wilson .................... A47B 21/06 312/223.6 |
| 4,838,175 A | * | 6/1989 | Hauville ................... B01L 9/02 108/25 |
| 6,338,301 B1 | * | 1/2002 | Almond .................. A47B 21/06 108/26 |
| 6,895,868 B1 | * | 5/2005 | Cronk ..................... A47B 21/06 108/50.02 |
| 7,205,488 B2 | * | 4/2007 | Riner ...................... H02G 3/185 174/481 |
| 8,943,978 B2 | * | 2/2015 | Soper ...................... A47B 21/06 108/50.02 |
| 2010/0326329 A1 | * | 12/2010 | Kiekhaefer .............. A47B 9/14 108/25 |
| 2014/0124641 A1 | * | 5/2014 | Kassanoff .............. A47B 17/04 248/447 |

(Continued)

FOREIGN PATENT DOCUMENTS

| | | | |
|---|---|---|---|
| DE | 102016120021 | * | 4/2018 |
| EP | 2476339 | * | 7/2012 |
| WO | 2017123228 | * | 7/2017 |

*Primary Examiner* — Janet M Wilkens
(74) *Attorney, Agent, or Firm* — Spencer Fane LLP; Steven J. Laureanti

(57) ABSTRACT

A system for workstation power trough including: a planar body; an access through the planar body, the access comprising a slot, an opening, and a plurality of first notches; a panel adapted to fit within the opening; and a power trough connected to a bottom surface of the planar body, the power trough configured to enclose a power unit; whereby a cable may be routed through the access and coupled to the power unit. A method of using a workstation power trough comprising the steps of rotating the panel to an open position, routing a first end of the cable through the access into the power trough, coupling the first end of the cable to the power unit, rotating the panel to a closed position, sliding the cable along the slot, and securing the cable into one of the plurality of first notches.

18 Claims, 12 Drawing Sheets

(56) References Cited

U.S. PATENT DOCUMENTS

2015/0173505 A1* 6/2015 Mirth ............... A47B 13/16
                                                 211/186
2017/0324230 A1* 11/2017 Warrilow ........... A47B 21/06
2019/0142155 A1* 5/2019 Lee ................. A47B 87/002
                                                 108/27

* cited by examiner

SYSTEM AND METHOD FOR A WORKSTATION POWER TROUGH

TECHNICAL FIELD

The disclosed subject matter relates generally to a power trough and more particularly, to a system and method for a workstation power trough.

BACKGROUND

Today's modern workstations require the routing and storage of multiple power and data cables below a working surface. If not managed properly, the power and data cables become tangled and unsightly. Workstations that include movable working surfaces have the additional challenge of the power and data cables being pulled loose from their power supply, or becoming caught on support structures of the workstation when the working surface is raised or lowered. As such, there is a need to provide an access through the working surface to a power trough connected to an underside of the working surface so power and data cables can reach a power source when the working surface is raised or lowered.

Some workstations include openings in the working surface to assist the routing and management of power and data cables through the working surface. However, the size of the opening limits the number of cables that may be routed through the opening, especially cables that include plugs at one end. As such, there is a need to provide a working surface comprising an access configured to allow cables and plugs to pass through an opening of the working surface and subsequently moved out of the opening to make way for additional cabling to pass through the opening.

SUMMARY

An embodiment of the disclosed subject matter includes: a planar body; an access configured through the planar body; a panel adapted to fit within a portion of the access; and a power trough connected to a bottom surface, the power trough configured to enclose a power unit; whereby the power unit is accessible through the access. The access having a slot disposed through the planar body, where the slot includes a rear wall. The access further having an opening disposed through the planar body along the rear wall. The access further having a plurality of first notches disposed through the planar body along the rear wall.

In an embodiment of the disclosed subject matter, the power trough includes a compartment having an upper section and a lower section, wherein the upper section is connected to the bottom surface along an upper peripheral edge of the upper section. The power trough further includes a cover configured to enclose the power unit within the lower section, the cover comprising a first hole, wherein a power receptacle of the power unit is accessible through the first hole.

In an embodiment of the disclosed subject matter, the cover includes a first slot extending from the upper peripheral edge to a first position below the cover, and may further include: a first peripheral edge having a second notch centrally disposed along the first peripheral edge; a second peripheral edge perpendicular to the first peripheral edge; a third peripheral edge opposite the second peripheral edge; a third notch centrally disposed along the second peripheral edge, wherein the third notch is approximately positioned above a second hole in a bottom floor of the lower section; and a fourth notch centrally disposed along the third peripheral edge, wherein the fourth notch is approximately positioned above a third hole in the bottom floor.

In an embodiment of the disclosed subject matter, the planar body includes a cavity in the top surface proximate the plurality of first notches. The cavity extending along the rear wall. The planar body further includes an insert connected to the planar body within the cavity. The insert has a front insert edge parallel to the rear wall, and a plurality of slits extending perpendicularly away from the front insert edge, where the plurality of slits are centrally aligned above the plurality of first notches.

In an embodiment of the disclosed subject matter, the slot is approximately parallel to a rear edge of the planar body for the organization and routing of cables into the power trough below.

In an embodiment of the disclosed subject matter, the panel further includes a hinge connected between the panel and planar body; whereby rotation of the panel exposes the opening for routing cables into the power trough.

In an embodiment of the disclosed subject matter, the system includes a support structure connected to the bottom surface of the planar body. The support structure includes a pair of lifts adapted to adjust a distance between the planar body and support structure.

In an embodiment of the disclosed subject matter, the system includes a pair of planar bodies moveably connected to the support structure. The planar bodies are disposed opposite each other on the support structure. A divider is vertically connected to the support structure; the divider being disposed between the pair of planar bodies.

In an embodiment of the disclosed subject matter, a method of using the workstation power trough, the method includes the steps of: providing a system for a workstation power trough, the system comprising: a planar body having a top surface and a bottom surface; an access configured between the top surface and the bottom surface, the access comprising: a slot disposed through the planar body between the top surface and the bottom surface; an opening disposed through the planar body along the slot; and a plurality of first notches disposed through the planar body along the slot; a panel adapted to fit within the opening, the panel pivotally connected to the planar body; and a power trough configured to enclose a power unit comprising a power unit, the power trough connected to the bottom surface; whereby the power unit is accessible through the access; rotating the panel to an open position; routing a first end of a cable through the access into the power trough; coupling the first end of the cable to the power unit; rotating the panel to a closed position; sliding the cable along the slot; and securing the cable into one of the plurality of first notches.

BRIEF DESCRIPTION OF THE DRAWINGS

The drawings constitute a part of this specification and include exemplary embodiments of the disclosed subject matter and illustrate various objects and features thereof.

DETAILED DESCRIPTION

Figure 1:
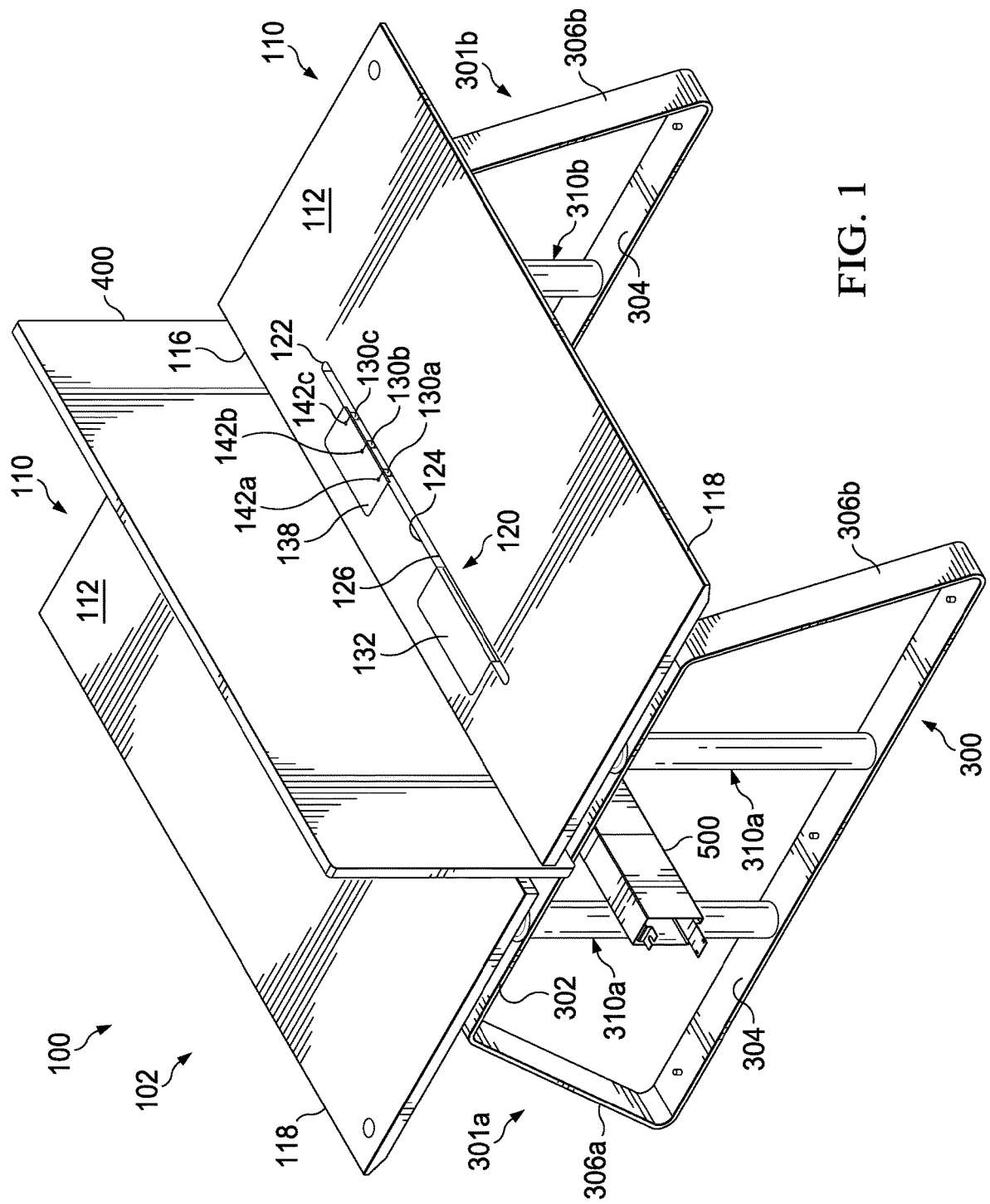
FIG. 1. illustrates an isometric view of an embodiment of the disclosed subject matter.
Figure 2:
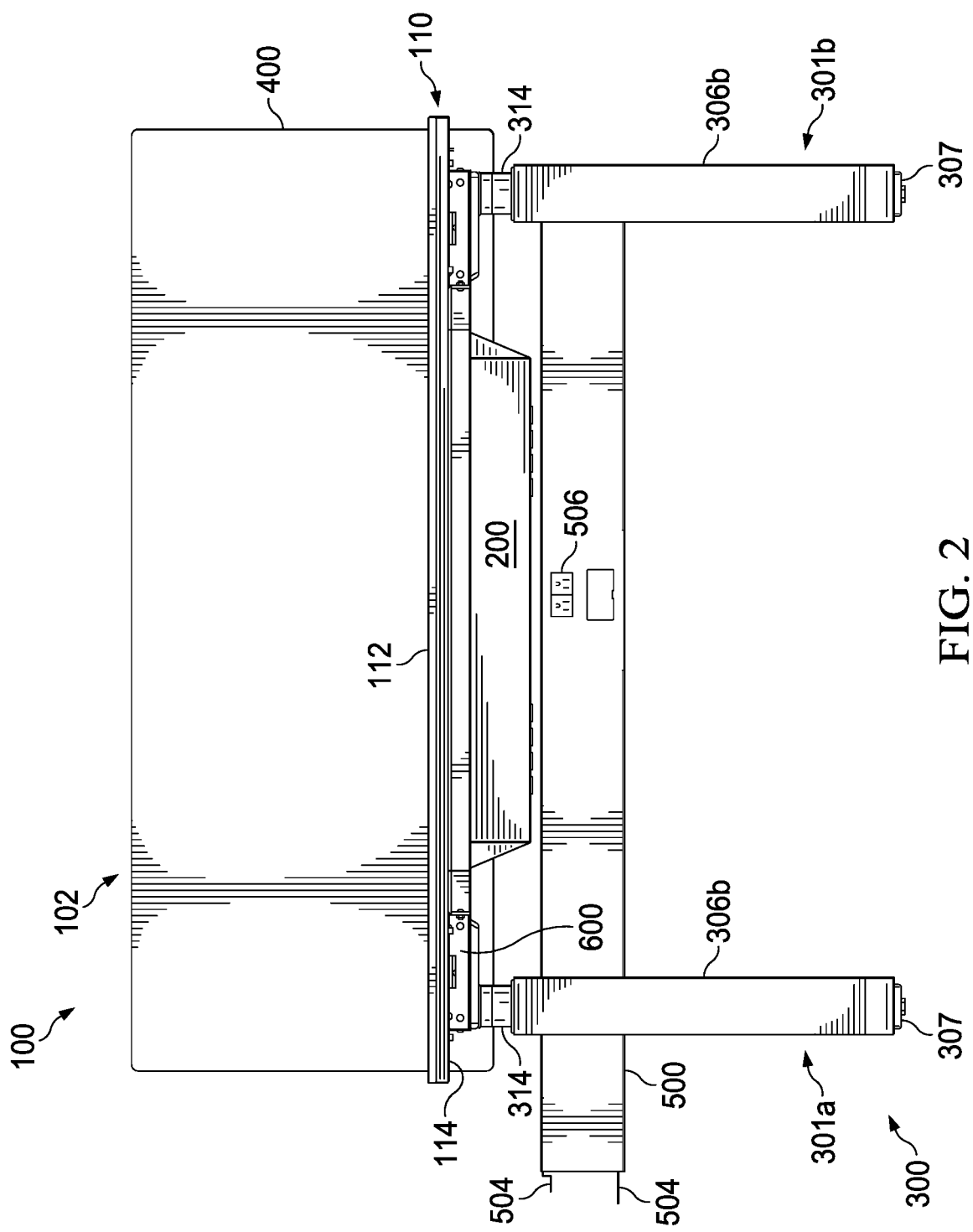
FIG. 2 illustrates a front view of an embodiment of the disclosed subject matter.
Figure 3:
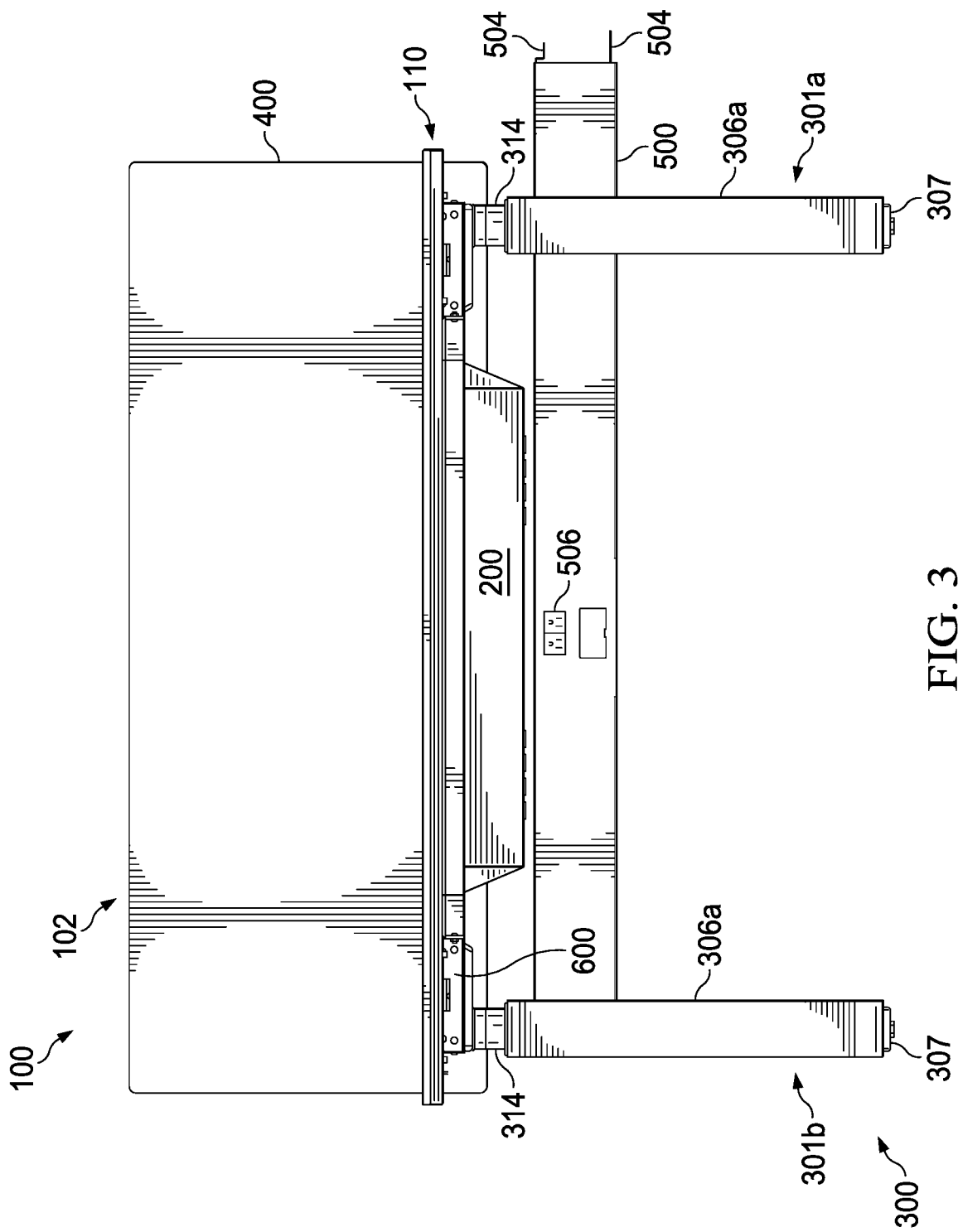
FIG. 3 illustrates a rear view of an embodiment of the disclosed subject matter.
Figure 4:
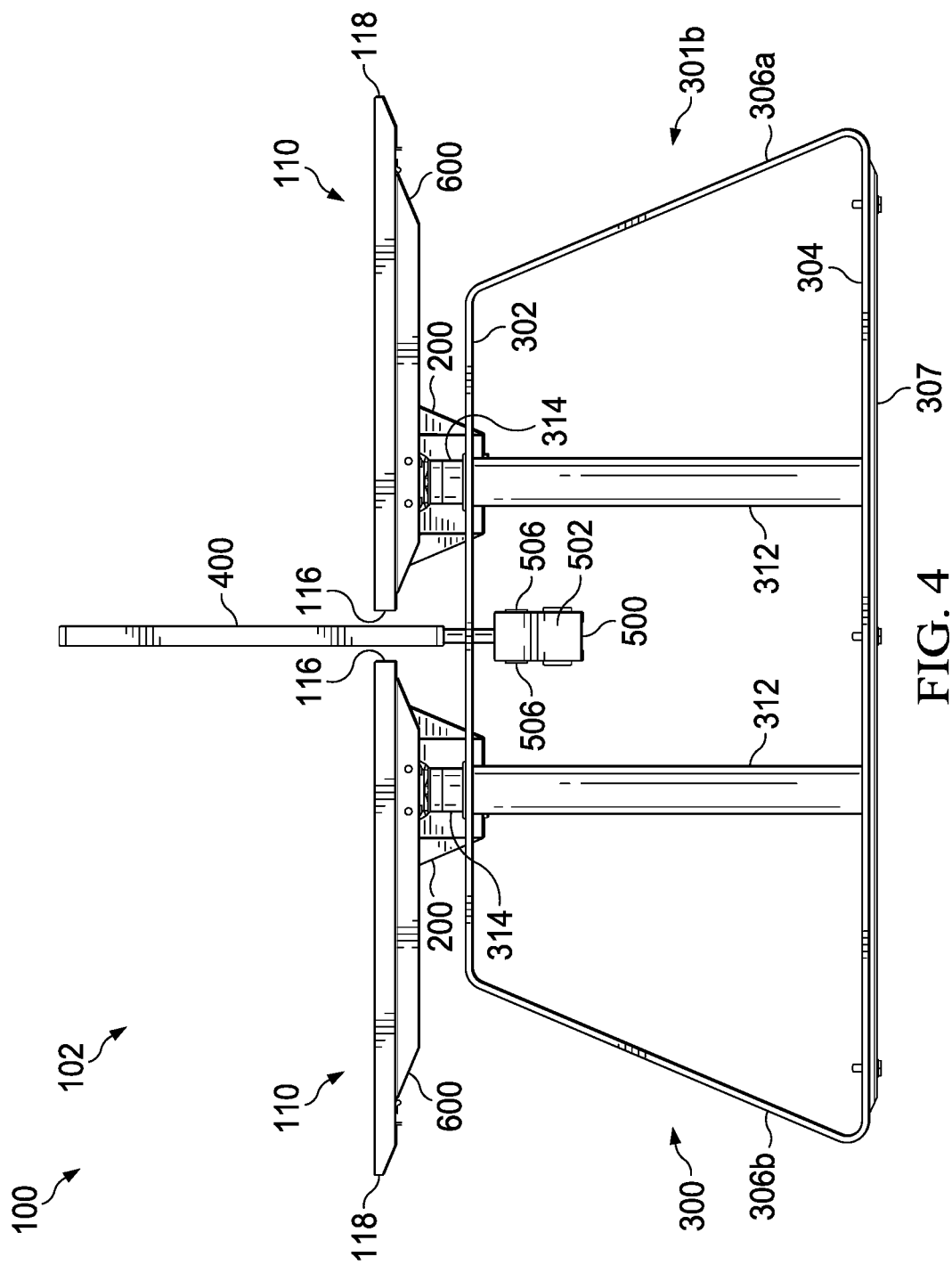
FIG. 4 illustrates a side view of an embodiment of the disclosed subject matter.
Figure 5:
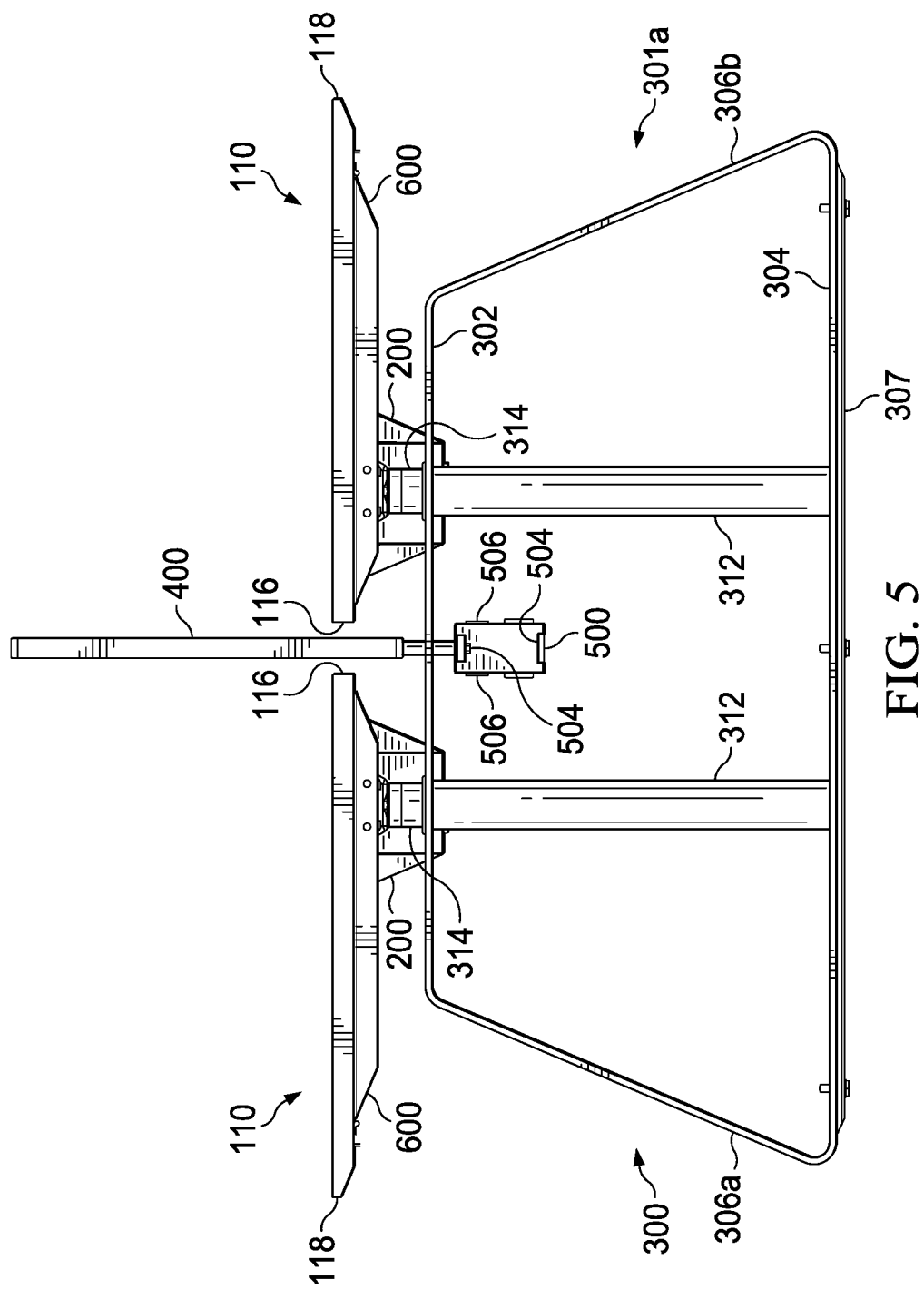
FIG. 5 illustrates a side view of an embodiment of the disclosed subject matter.
Figure 6:
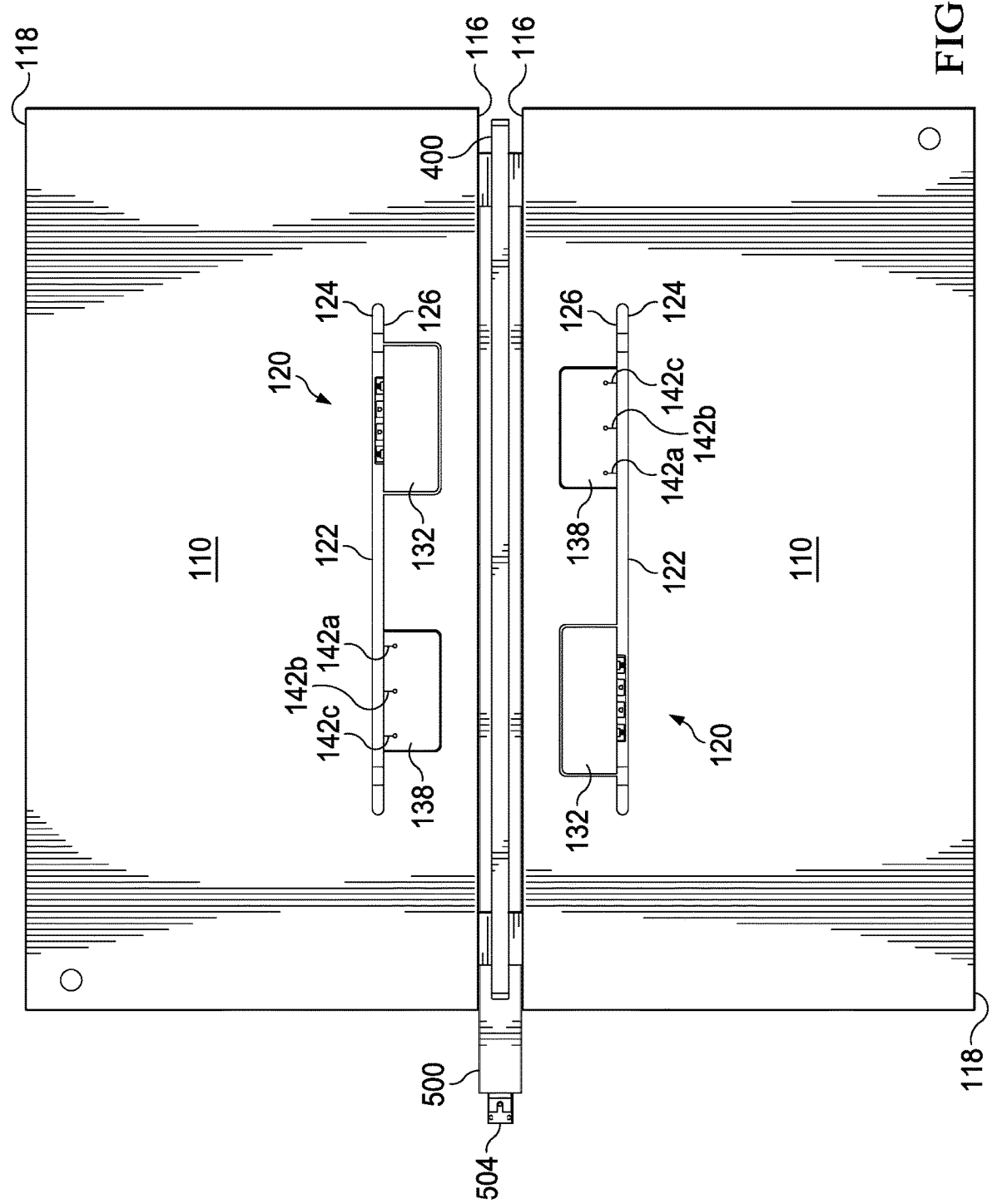
FIG. 6 illustrates a top view of an embodiment of the disclosed subject matter.

As required, detailed aspects of the disclosed subject matter are disclosed herein; however, it is to be understood that the disclosed aspects are merely exemplary of the disclosed subject matter, which may be embodied in various forms. Therefore, specific structural and functional details disclosed herein are not to be interpreted as limiting, but merely as a basis for the claims and as a representative basis for teaching one skilled in the art how to variously employ the disclosed technology in virtually any appropriately detailed structure.

Certain terminology will be used in the following description, and are shown in the drawings, and will not be limiting. For example, up, down, front, back, right and left refer to the disclosed subject matter as orientated in the view being referred to. The words, "inwardly" and "outwardly" refer to directions toward and away from, respectively, the geometric center of the aspect being described and designated parts thereof. Said terminology will include the words specifically mentioned, derivatives thereof and words of similar meaning.

Referring to the drawings, FIGS. 1-6 illustrate an aspect of the disclosed subject matter, the system 100 may comprise a workstation 102 comprising a planar body 110; a support structure 300; and a lift system 308 connected between the planar body 110 and support structure 300. The system 100 may further comprise a planar body 110 comprising an access 120 configured between a top surface 112 and a bottom surface 114, the access 120 comprising: a linear slot 122 disposed through the planar body 110 between the top surface 112 and the bottom surface 114; the linear slot 120 comprising a front wall 124 and a rear wall 126; an opening 128 disposed through the planar body 110 along the rear wall 126; and a plurality of first notches 130a, 130b, 130c disposed through the planar body 110 along the rear wall 126; a panel 132 dimensioned to fit within the opening 128; the panel 132 pivotally connected to the planar body 110; and a power trough 200 configured to enclose a power unit 202 comprising a power receptacle 204 (shown in FIG. 9); the power trough 200 connected to the bottom surface 114.

In an embodiment of the disclosed subject matter, the slot 122 may be approximately linear in form and may be disposed approximately parallel to a rear edge 116 of the planar body 110. The top surface 112 of the planar body 110 may be approximately rectangular in form, and may be configured as other shapes such as a square, a polygon, a circle, and/or an oval. The planar body 110 may be constructed of wood, plastic, metal and/or other rigid materials.

In a preferred embodiment of the disclosed subject matter, the top surface 112 may be approximately rectangular in shape and have the peripheral dimensions of approximately 30 inches by approximately 60 inches.

In an embodiment of the disclosed subject matter, the workstation 102 may comprise a support structure 300 comprising a pair of support frames 301a, 301b, the pair of support frames (301a, 301b) may comprise an upper support member 302; a lower support member 304 generally parallel to the upper support member 302; a pair of legs 306a, 306b connected between the upper support member 302 and lower support member 304; and a base 307 connected to the lower support 304. In an aspect of the disclosed subject matter, the upper support member 302 may be shorter than the lower support member 304; whereby the legs 306a, 306b form an acute angle with the lower support member 304. In a preferred embodiment of the disclosed subject matter, the acute angle is between approximately 60 degrees and approximately 70 degrees, and more preferably approximately 67 degrees. The support structure 300 may be constructed of wood, plastic, metal and/or other rigid materials.

In an embodiment of the disclosed subject matter, the lift system 308 may comprise a pair of lifts 310a, 310b connected between the support structure 300 and planar body 110; the pair of lifts 310a, 310b adapted to adjust a distance between the planar body 100 and support structure 300. The pair of lifts 310a, 310b may each comprise an outer lift member 312 connected between the upper support member 302 and lower support member 304; and an inner lift member 314 slidably connected to the outer lift member 312, the inner lift member 314 connected to the planar body 110; whereby the planar body 110 may be raised or lowered by moving the inner lift member 314 within the outer lift member 312.

In an embodiment of the disclosed subject matter, the workstation 102 may comprise a pair of planar bodies 110 disposed between a divider 400 centrally connected to the upper support member 302. The divider 400 may be connected to the upper support member by means of connection hardware such bolts, nuts, and/or screws. The two planar bodies 110 may be adapted to move independently of each other. The divider 400 may be constructed of steel, wood, plastic, rubber, and/or fabric. In an aspect of the disclosed subject matter, the diver 400 may be approximately rectangular in shape and have a length of approximately 58 inches, a width of approximately 1 inch, and height of approximately 22 inches.

In an embodiment of the disclosed subject matter, the workstation 102 may further comprises a power beam 500 connected to the upper support member 302, the power beam 500 may be positioned below the upper support member 302. The power beam 500 may be adapted to house electrical components such as power/data cables and/or power elements such as power receptacles 506. The power beam 500 may comprise connection tabs 504 adapted to connect the power beam 500 to an adjacent power beam (not shown), if so desired. Alternatively, the power beam 500 may comprise an end cap 502 at one or both distal ends.

Figure 7:
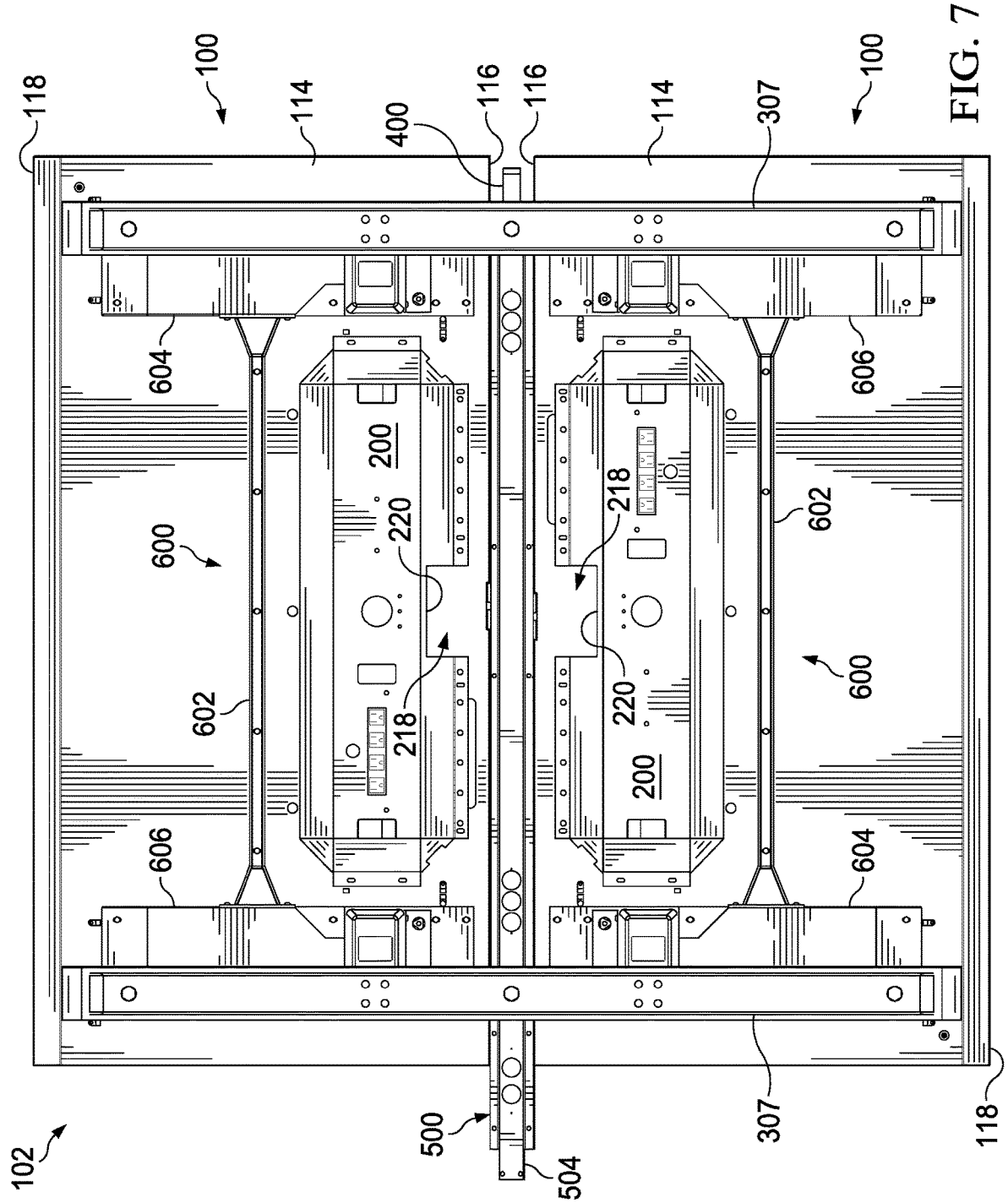
FIG. 7 illustrates a bottom view of an embodiment of the disclosed subject matter.
Figure 8:
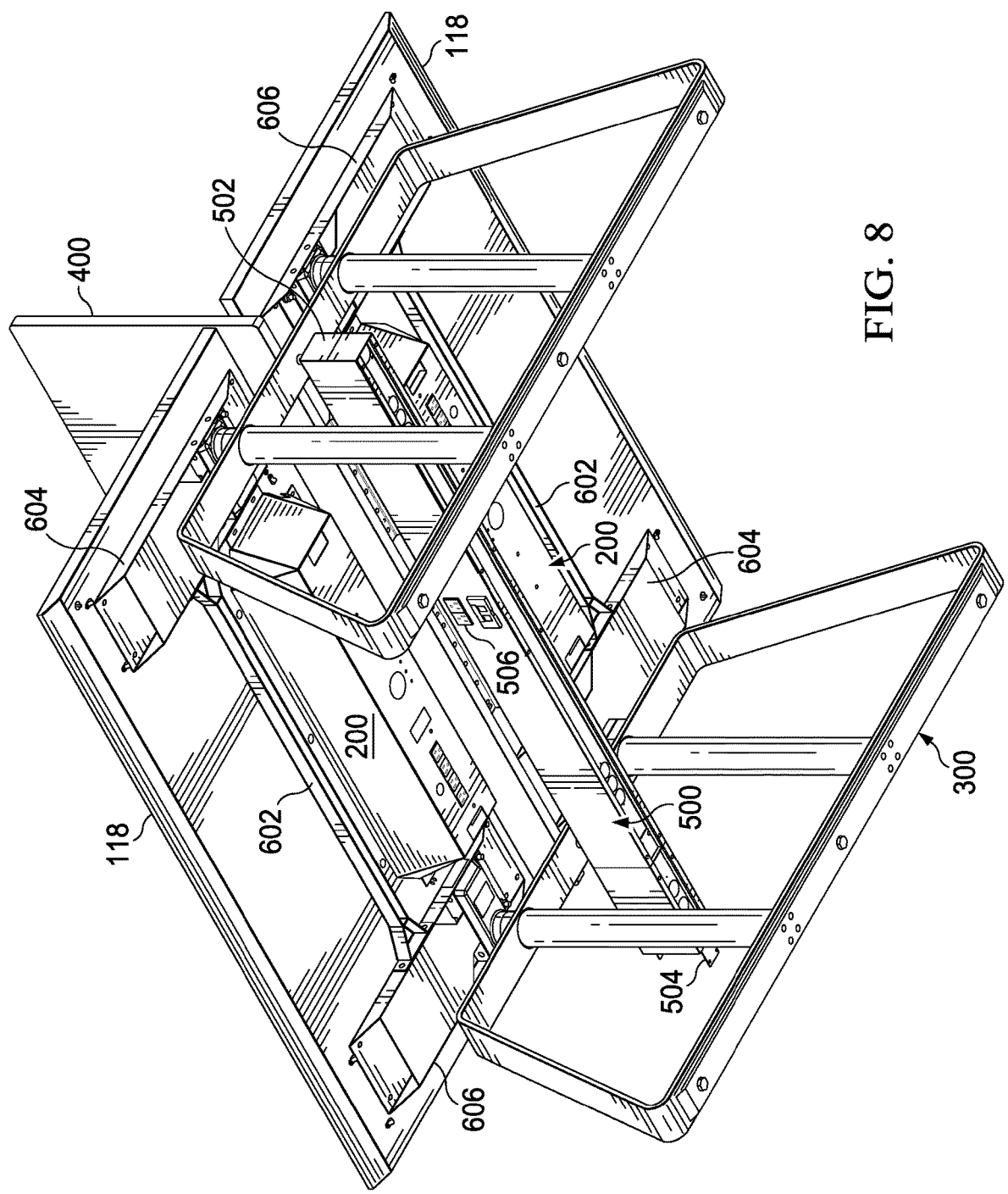
FIG. 8 illustrates an isometric view of an embodiment of the disclosed subject matter.

Referring to the drawings, FIGS. 7 and 8 illustrate an embodiment of the disclosed subject matter, the planar body 110 may further comprises a plate assembly 600 connected to the bottom surface 112. The plate assembly 600 provides rigidity to the planar body 110, and may further comprise a central beam 602 disposed approximately parallel to the front edge 118; a right plate 604 connected to a distal end of the central beam 602 near the inner lift member 314; and a left plate 604 connected to the opposite distal end of the central beam 602 near the inner lift member 314. The right plate 604 may be aligned approximately perpendicular to the left plate 606. The plate assembly 600 may be constructed on steel, aluminum, plastic and/or other rigid material.

Figure 9:
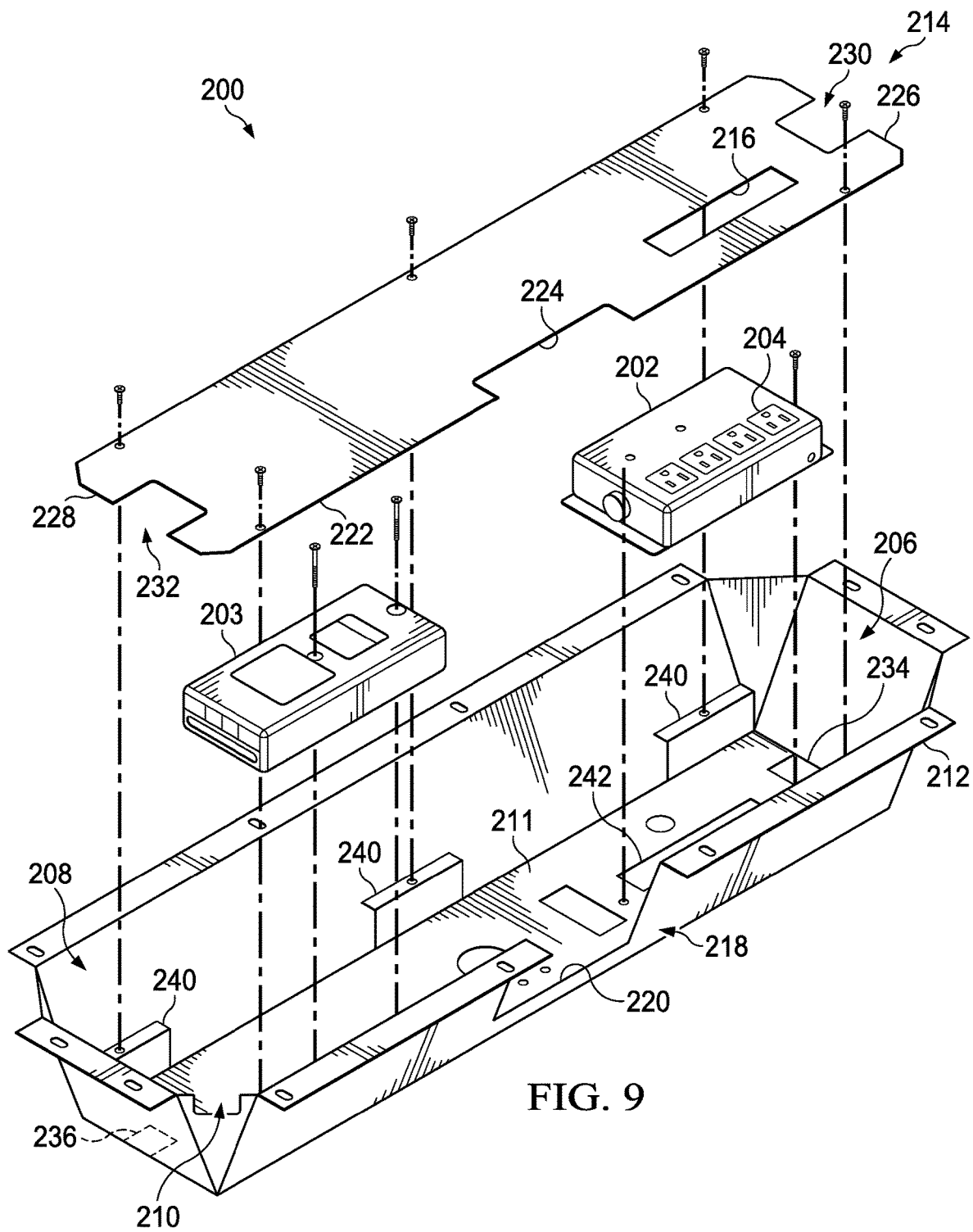
FIG. 9 illustrates an exploded view of an embodiment of the disclosed subject matter.

Referring to the drawings, FIGS. 7-9 illustrate an aspect of the disclosed subject matter, the power trough 200 is connected to the bottom surface 114 between the central beam 602 and the rear edge 116 of the planar body 110. The power trough 200 may be located below the access 120 in order to provide electrical communication to the power trough 200 through the access 120. The power trough 200 may further comprise a compartment 206 having an upper section 208 and a lower section 210; whereby the upper section 208 is connected to the bottom surface 144 along an upper peripheral edge 212 of the upper section 208; and a cover 214 configured to enclose the power unit 202 and a motor control unit 203 within the lower section 210. The cover 214 may be connected to a plurality of struts 240 positioned along the sidewalls of the power trough 200 by means of hardware such as nuts, bolts and/or screws.

In an aspect of the disclosed subject matter, the cover 214 may further comprise a first peripheral edge 222; a second peripheral edge 226 perpendicular to the first peripheral edge 222; and a third peripheral edge 228 opposite the second peripheral edge 226; wherein a second notch 224 is centrally disposed along the first peripheral edge 222; wherein a third notch 230 is centrally disposed along the second peripheral edge 226; and wherein a fourth notch 232 is centrally disposed along the third peripheral edge 228. The cover 214 may further comprise a first hole 216, wherein the first hole 216 may be located approximately adjacent to the power receptacle 204 in order to provide electrical communication between the upper section 208 and lower section 210.

The compartment 206 may further comprise a first slot 218 extending from the upper peripheral edge 212 to a first position 220 below the cover 214. The first slot 218 configured to provide access to the upper section 208 and to lower section 210. An aperture 242 in a bottom floor 211 of the compartment 206 may be approximately aligned below the power unit 202 in order to provide electrical communication to the power unit 202 from outside the power trough 200. The bottom floor 211 may comprise a second hole 234 positioned approximately below the third notch 230; and a third hole 236 positioned approximately below the fourth notch 232.

Figure 10:
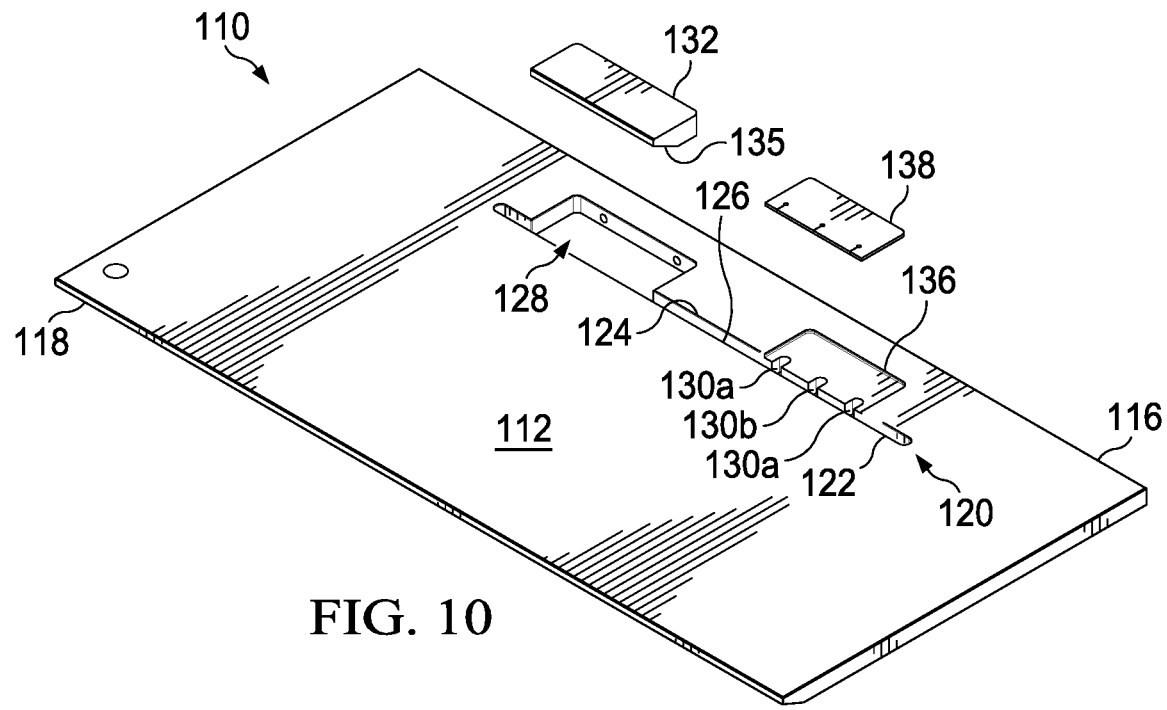
FIG. 10 illustrates an isometric view of an embodiment of the disclosed subject matter.
Figure 11:
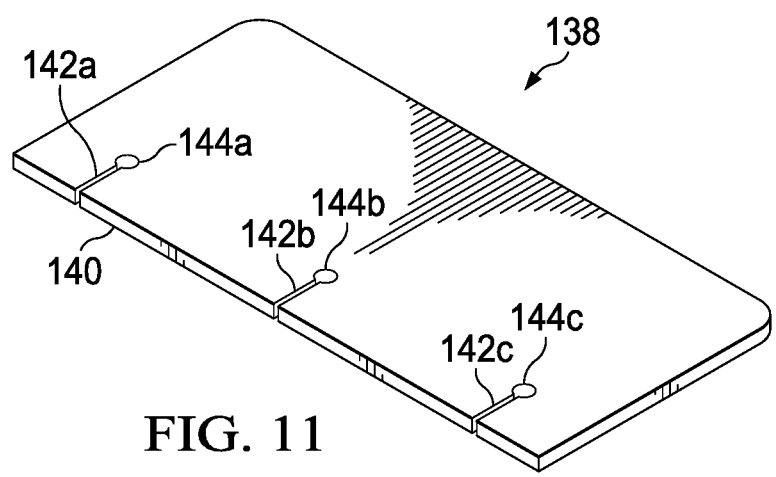
FIG. 11 illustrates an isometric view of an embodiment of the disclosed subject matter.

Referring to the drawings, FIGS. 10 and 11 illustrate an aspect of the disclosed subject matter, the planar body 110 may comprise: an access 120 having a slot 122, an opening 128, and a plurality of first notches 130a, 130b, 130c. The opening 128 positioned along a rear wall 126 of the slot 122; whereby a continuous open space is created between the slot 122 and the opening 128. The opening 128 may be configured to pass an electrical plug or data plug (not shown) through the top surface 112 and into the upper section 208 of the power trough 200. The slot 122 may be configured to pass an electrical cable or data cable (not shown) through the top surface 122 and into the upper section 208 of the power trough 200. The slot 122 may be further configured to allow the movement of a plurality of power cables or data cables (not shown) within slot 122. The plurality of first notches 130a, 130b, 130c adapted to accept and secure a portion of a power cable or data cable (not shown) within the plurality of first notches 130a, 130b, 130c.

In an aspect of the disclosed subject matter, the slot 122 may be approximately parallel to a rear edge 116 of the planar body 110, and may have a length of approximately 34 inches and a width of approximately 0.75 inches. Furthermore, the opening 128 may have a length of approximately 10 inches and a width of approximately 3.75 inches.

In a preferred embodiment of disclosed subject matter, the planar body 110 may further comprise: a cavity 136 in the top surface 112 proximate the plurality of first notches 130a, 130b, 130c; the cavity 136 extending along and away from the rear wall 126; and an insert 138 connected to the planar body 110 within the cavity 136; the insert 138 may comprise a front insert edge 140 parallel to the rear wall 126; and a plurality of slits 142a, 142b, 142c extending perpendicularly away from the front insert edge 140; the slits 142a, 142b, 142c centrally aligned above the plurality of first notches 130a, 130b, 130c. The insert 138 may further comprise a plurality of insert holes 144a, 144b, 144c formed through the insert 138 at the distal end of the plurality of slits 142a, 142b, 142c; whereby a power cable or data cable (not shown) may pass through one of the plurality of slits 142a, 142b, 142c and snuggly fit within one of the plurality of insert holes 144a, 144b, 144c.

Figure 12:
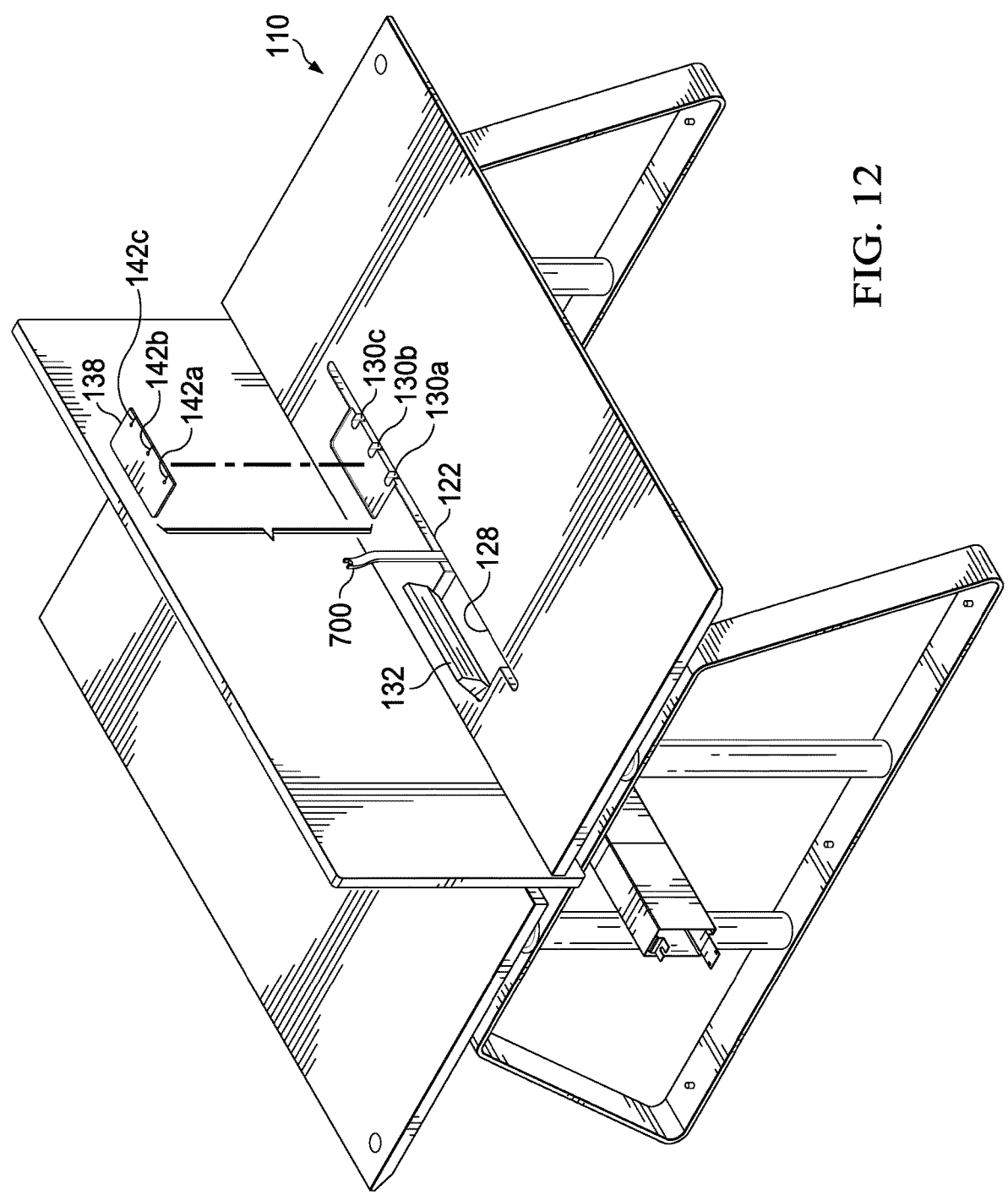
FIG. 12 illustrates an isometric view of an embodiment of the disclosed subject matter.

Referring to FIG. 12 illustrate an aspect of the disclosed subject matter, the planar body 110 is shown having a panel 132 in an open position; whereby an electrical plug or adapter (not shown) may be passed through the opening 128 and slot 122 in to the power trough 200 below (not shown). A portion of the cable 700 connected to the electrical plug or adapter may then be passed along the slot 122 and into one of the plurality of first notches 130a, 130b, 130c; and thereafter secured within one of a plurality of slits 142a, 142b, 143c of the insert 138. Alternatively a portion of the cable 700 may be positioned within the slot 122; whereby a plurality of cables may simultaneously be positioned in parallel alignment through the slot 122.

In a preferred embodiment of disclosed subject matter, the panel 132 may comprise a hinge (not shown) connected between the panel 132 and the planar body 110; wherein rotation of the panel outwardly from the top surface 112 and away from the slot 122 provides access to the opening 128 and power trough 200 below. The panel 132 may be provided with a beveled edge opposite the hinge. The panel 132 may be opened to provide additional space for the insertion or removal of power/data cables having large power plugs or adapters. Once the plug or adapter is inserted through the opening 128, the panel 132 may be closed to secure the associated power/data cable within the slot 122.

Figure 13:
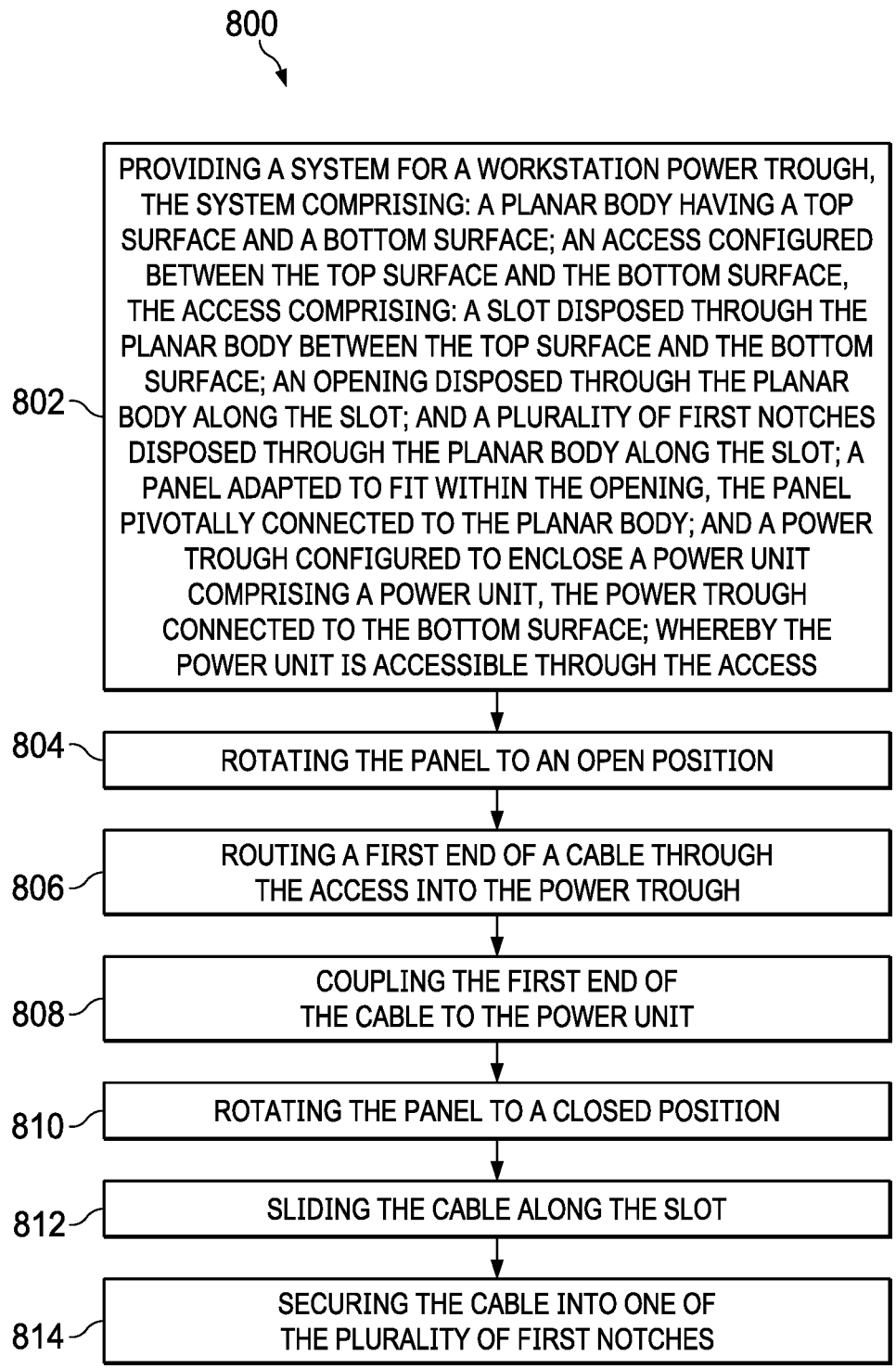
FIG. 13 illustrates a flow chart of a method of use of an embodiment of the disclosed subject matter.

In some embodiments, and referring to flow chart 800 of FIG. 13, a method for a workstation power trough is illustrated. The method may comprise providing a system for a workstation power trough, the system comprising a planar body having a top surface and a bottom surface, an access configured between the top surface and the bottom surface, the access comprising a slot disposed through the planar body between the top surface and the bottom surface, an opening disposed through the planar body along the slot, and a plurality of first notches disposed through the planar body along the slot, a panel adapted to fit within the opening, the panel pivotally connected to the planar body; and a power trough configured to enclose a power unit comprising a power unit, the power trough connected to the bottom surface; whereby the power unit is accessible through the access (block 802), rotating the panel to an open position (block 804), routing a first end of a cable through the access into the power trough (block 806), coupling the first end of the cable to the power unit (block 808), rotating the panel to a closed position (block 810), sliding the cable along the slot (block 812), and securing the cable into one of the plurality of first notches (block 814).

In some embodiments of the disclosed subject matter, the actions of routing a first end of a cable through the access into the power trough (block 806) may be performed prior to the step of rotating the panel to an open position (block 804). In some embodiments of the disclosed subject matter, the rotating step (block 810), the sliding step (block 812), and/or the securing step (block 814) may be eliminated in whole or in part.

It is to be understood that while certain aspects of the disclosed subject matter have been shown and described, the disclosed subject matter is not limited thereto and encompasses various other embodiments and aspects.

What is claimed is:

1. A system for a workstation power trough, the system comprising:
   a planar body comprising a top surface and a bottom surface;
   an access configured between the top surface and the bottom surface, the access comprising:
   a slot disposed through the planar body, the slot having a rear wall;
   an opening disposed through the planar body along the rear wall; and
   a plurality of first notches disposed through the planar body along the rear wall;
   a panel adapted to fit within the opening, the panel pivotally connected to the planar body; and
   a power trough comprising a cover and a compartment, the cover having a first hole and the compartment having an upper section, a lower section, and a first slot, wherein the upper section is connected to the bottom surface along an upper peripheral edge of the upper section and the first slot extends from the upper peripheral edge to a first position below the cover, the power trough configured to enclose a power unit within the lower section; whereby the power unit is accessible through the access and a power receptacle of the power unit is accessible through the first hole.

2. The system of claim 1, wherein the cover further comprises a first peripheral edge having a second notch centrally disposed along the first peripheral edge.

3. The system of claim 2, wherein the cover further comprises:
   a second peripheral edge perpendicular to the first peripheral edge;
   a third peripheral edge opposite the second peripheral edge;
   a third notch centrally disposed along the second peripheral edge, wherein the third notch is approximately positioned above a second hole in a bottom floor of the lower section; and
   a fourth notch centrally disposed along the third peripheral edge, wherein the fourth notch is approximately positioned above a third hole in the bottom floor.

4. The system of claim 1, wherein the planar body further comprises:
   a cavity in the top surface proximate the plurality of first notches; the cavity extending along the rear wall; and
   an insert connected to the planar body within the cavity; the insert comprising:
   a front insert edge parallel to the rear wall; and
   a plurality of slits extending perpendicularly away from the front insert edge, the plurality of slits centrally aligned above the plurality of first notches.

5. The system of claim 4, wherein the insert is approximately rectangular in shape.

6. The system of claim 5, wherein the insert is constructed of felt.

7. The system of claim 1, wherein the slot is approximately parallel to a rear edge of the planar body.

8. The system of claim 1, wherein the panel is further configured to pivot away from the top surface, whereby the power through may be accessed through the opening.

9. The system of claim 8, wherein the panel further comprises a hinge connected between the panel and planar body.

10. The system of claim 1, wherein the system further comprises a support structure connected to the bottom surface of the planar body.

11. The system of claim 10, wherein the support structure comprises a pair of lifts adapted to adjust a distance between the planar body and support structure.

12. A system for a workstation power trough, the system comprising:
    a pair of planar bodies moveably connected to a support structure, each of the planar bodies comprising a top surface and a bottom surface, each of the planar bodies further comprising:
    an access extending through the top surface and the bottom surface, the access comprising:
    a linear slot having a rear wall, the linear slot approximately parallel to a rear edge of the planar body;
    an opening disposed along the rear wall; and
    a plurality of first notches disposed along the rear wall;
    a panel adapted to fit within the opening, the panel pivotally connected to the planar body;
    a cavity in the top surface proximate the plurality of first notches; the cavity extending along the rear wall;
    a rectangular insert connected to the planar body within the cavity; the insert comprising:
    a front insert edge parallel to the rear wall; and
    a plurality of slits extending perpendicularly away from the front insert edge, the plurality of slits centrally aligned above the plurality of first notches;
    a power trough, connected to bottom surface, configured to enclose a power unit, the power trough comprising:
    a compartment having an upper section and a lower section; wherein the upper section is connected to the bottom surface along an upper peripheral edge of the upper section;
    a cover positioned between the upper section and the lower section, the cover configured to enclose the power unit within the lower section, the cover comprising:
    a first slot extending from the upper peripheral edge to a first position below the cover;
    a first peripheral edge having a second notch centrally disposed along the first peripheral edge;
    a second peripheral edge perpendicular to the first peripheral edge;
    a third peripheral edge opposite the second peripheral edge;
    a first hole disposed through the cover, the first hole located approximately above a power receptacle of the power unit;
    a third notch centrally disposed along the second peripheral edge, the third notch approximately positioned above a second hole in a bottom floor of the lower section; and a fourth notch centrally disposed along the third peripheral edge, the fourth notch approximately positioned above a third hole in the bottom floor; and a divider vertically connected to the support structure, the divider disposed between the pair of planar bodies.

13. A method of using a workstation power trough, the method comprising:

providing a system for a workstation power trough, the system comprising:

a planar body having a top surface and a bottom surface;

an access configured between the top surface and the bottom surface, the access comprising:

a slot disposed through the planar body between the top surface and the bottom surface;

an opening disposed through the planar body along the slot;

a plurality of first notches disposed through the planar body along the slot;

a panel adapted to fit within the opening, the panel pivotally connected to the planar body; and a power trough comprising a cover having a first hole and a compartment having an upper section, a lower section, and a first slot, wherein the upper section is connected to the bottom surface along an upper peripheral edge of the upper section and the first slot extending from the upper peripheral edge to a first position below the cover, the power trough configured to enclose a power unit within the lower section; whereby the power unit is accessible through the access and a power receptacle of the power unit is accessible through the first hole;

rotating the panel to an open position;

routing a first end of a cable through the access into the power trough; and coupling the first end of the cable to the power unit.

14. The method of claim 13, further comprising rotating the panel to a closed position.

15. The method of claim 14, further comprising sliding the cable along the slot.

16. The method of claim 15, further comprising securing the cable into one of the plurality of first notches.

17. The method of claim 13, further comprising sliding the cable along the slot.

18. The method of claim 17, wherein securing the cable into one of the plurality of first notches comprises securing a data cable or a power cable into one of the plurality of first notches.

* * * * *